US006389817B1

(12) United States Patent
Smith

(10) Patent No.: US 6,389,817 B1
(45) Date of Patent: May 21, 2002

(54) INTERNAL TEMPERATURE CONTROL FOR A MICRODRIVE

(75) Inventor: Gordon James Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/603,359

(22) Filed: Jun. 26, 2000

(51) Int. Cl.[7] .......................... F25B 21/02; F25D 23/12
(52) U.S. Cl. ............................. 62/3.2; 62/259.2; 62/3.3
(58) Field of Search ............................. 62/3.2, 3.3, 3.7, 62/259.2

(56) References Cited

U.S. PATENT DOCUMENTS

| 5,093,832 A | * | 3/1992 | Bethune et al. | 372/21 |
| 5,483,799 A | * | 1/1996 | Dalto | 62/3.7 |
| 5,603,220 A | * | 2/1997 | Seaman | 62/3.7 |
| 5,689,654 A | * | 11/1997 | Kikinis et al. | 395/281 |
| 6,055,814 A | * | 5/2000 | Song | 62/3.2 |
| 6,088,662 A | * | 7/2000 | Flinsbaugh et al. | 702/132 |
| 6,105,381 A | * | 8/2000 | Ghoshal | 62/259.2 |
| 6,196,003 B1 | * | 3/2001 | Macias et al | 62/3.7 |

* cited by examiner

Primary Examiner—William C. Doerrler
(74) Attorney, Agent, or Firm—Christopher H. Lynt; Matthew J. Bussan

(57) ABSTRACT

The internal temperature of a small, temperature-sensitive device, such as a microdrive, can be controlled using a thermoelectric unit to permit the temperature-sensitive device to be used in a wider range of installations. In particular, a thermoelectric unit is provided at the housing of the temperature-sensitive device. A Peltier thermoelectric module is advantageously used to thereby provide an environmental shell that operates in either a heating or a cooling mode.

21 Claims, 2 Drawing Sheets

Top view of Microdrive with cover removed
Top view of Microdrive cover
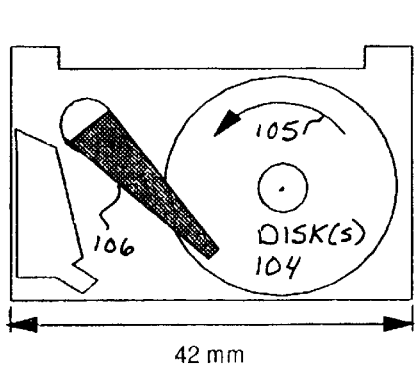
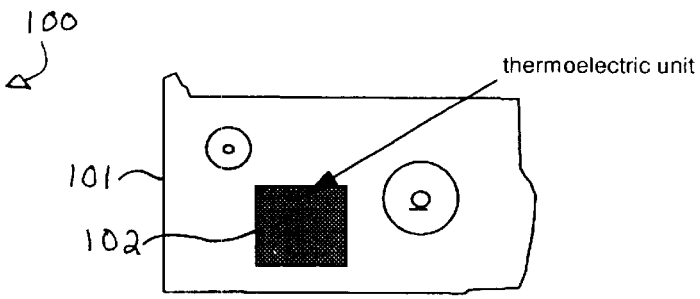
FIG. 1A
FIG. 1B
Side view of Microdrive with cover removed
Side view of Microdrive cover
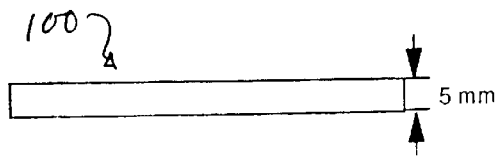
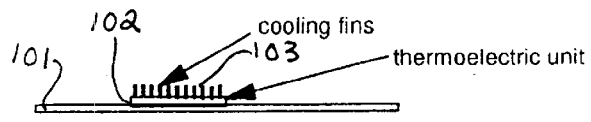
FIG. 1C
FIG. 1D

INTERNAL TEMPERATURE CONTROL FOR A MICRODRIVE

BACKGROUND OF THE INVENTION

1. Field of the Invention

The invention relates to the field of small temperature-sensitive devices, and in particular, to temperature control for small disk drives.

2. Background Information

Small, temperature-sensitive electronic and electromechanical devices, such as micro disk drives, are being developed and used. However, many potential applications for these devices, such as in automotive vehicles, are presently ruled out because of a mismatch between device operating temperature specifications/limitations and automotive operating temperatures. This is true at both the low temperature end and high temperature end of the respective operating temperatures. Besides vehicles, the temperature environment for the emerging market of wearable computers may also be outside of the normal specifications for such devices under certain circumstances.

Existing temperature control methods and adaptations are generally inadequate and/or have drawbacks which make them inapplicable to such devices in these environments. Therefore, there is a need for better temperature control methods and apparatus to adapt these temperature-sensitive devices to be used in a wider variety of operating environments having a wider range of temperatures, such as may be found in the automotive and wearable computer environments.

The present invention is directed to solving the problem of improving temperature control for small, temperature-sensitive devices. In particular, the present invention has been developed to control the temperature environment of 'microdrives,' such as those manufactured by IBM (IBM is a registered trademark of International Business Machines). Microdrives, as the term is used herein, are direct access storage devices (DASD's) in miniaturized form, e.g., packaged in a relatively small, thin housing, for example, having a thickness of approximately 5 mm or less, and outer dimensions of under 50 mm. In other words, about the size of a small match-box. It should be clear that the inherent small size and low power consumption that a microdrive can provide would clearly be advantageous in situations where these are at a premium, such as in a hand-held device, a wearable computer, or a vehicle.

However, one of the current unresolved issues with using a microdrive in an automotive setting is the mismatch between the automotive operating temperature specifications and those of the microdrive. Disadvantageous external cooling and/or heating apparatus may be required thereby destroying the size and power advantages the microdrive would otherwise provide. To date there have been no solutions proposed that are built into the microdrive. In order to gain rapid acceptance of the microdrive in automotive environments (and other stressed environments), it would be advantageous for the microdrive be a complete OEM entity, that is, having adequate temperature controls already built in.

As with regular-sized DASD's, microdrives have one or more storage disks which are rotated by a motor and one or more read/write heads. When 'loaded,' that is, positioned for operation with respect to the storage disks over data storage areas, the read/write heads operate to read and write data to and from the storage disks. When not loaded, the heads are 'parked,' that is, positioned at an area off the disk surfaces sometimes called a 'load/unload ramp', which is typically located adjacent to the outer edge of the disks in the disk drive.

In practice, based on tests, a microdrive motor can be started and spun without the heads loaded at a temperature as low as −30 C. After the drive reaches a temperature of 5 degrees C. (the lower operating temperature specification), the heads can be loaded and the drive is ready for use. Therefore, some means to warm the microdrive may be required in certain environments.

On the other hand, a microdrive disposed inside of an automobile, for example, might reach a high temperature of 75 degrees C. (non-operating). However, the upper operating temperature of a typical microdrive is around 55 degrees C. Therefore, some means to cool the microdrive down to its operating temperature range is required.

Solid state heating/cooling devices, for example the Peltier thermoelectric module, are known. These modules produce a temperature differential between two surfaces. The effect was discovered in 1834 by Peltier. When a current passes through the junction of two different conductors, it results in a temperature change. The Peltier effect is a thermocouple in reverse. Instead of producing a voltage proportional to temperature, a voltage is used to produce a temperature difference between the two metals in a thermocouple junction. In order to optimize the effect, Peltier devices today use semiconductors such as bismuth telluride. The devices that are commercially available are a sandwich structure as small as 2 millimeters (mm) square and 1 mm thick. Which of the plates is hot and which is cold depends ONLY on the direction of DC current flow.

SUMMARY OF THE INVENTION

It is, therefore, a principle object of this invention to provide a method and apparatus for controlling the internal temperature of a small device.

It is another object of the invention to provide a method and apparatus that solves the above mentioned problems so that small, temperature-sensitive devices can be used in a wider range of environments and applications.

These and other objects of the present invention are accomplished by the method and apparatus disclosed herein.

According to an aspect of the invention, an environmental shell is provided that operates in either a heating or cooling mode.

According to another aspect of the invention, heat transfer, either to or from the drive, is aided by the rotating disk or disks inside of the drive. By using the rotating disks as a means to circulate air, one of the limitations of solid state heating/cooling devices, such as a Peltier thermoelectric module, is advantageously overcome, since such devices require a fan or other air circulation mechanism.

According to another aspect of the invention a specially designed cover plate for a microdrive that incorporates a thermoelectric module is provided.

According to another aspect of the invention, a Peltier thermoelectric module is used. The thermoelectric module produces a temperature differential between two surfaces when a current passes through the junction of two different conductors, resulting in a temperature change. This effect was discovered in 1834 by Peltier.

According to another aspect of the invention, the thermoelectric module uses semiconductors such as bismuth telluride. Further, the module is a sandwich structure which may be as small as 2 millimeters (mm) square and 1 mm thick.

According to another aspect of the invention, the thermoelectric module has plates and which of the plates is hot/heated and which is cold/cooled depends only on the direction of direct current flow (DC).

According to another aspect of the invention, the thermoelectric module is integrated into the cover of a microdrive, so that the interior of the microdrive can either be heated or cooled.

According to another aspect of the invention, when cooling the interior, the outside of the microdrive is more efficiently cooled by providing a separate fan combined with fins on the drive.

According to another aspect of the invention, the thermoelectric cooling module can be placed either inside of the microdrive casting or on the outside. In a preferred embodiment, the cooling module is outside of the casting and attached to the top cover of the microdrive. In another preferred embodiment, the thermoelectric cooling unit may be provided with fins and integrated with the top cover of the microdrive.

According another aspect of the invention, miniature thermoelectric modules are used, having dimensions compatible with the size of the microdrive, and which are easily capable of providing over 10 watts of heating power. Since the mass of a typical microdrive is about 16 grams, the required heating or cooling energy required to bring the microdrive to within correct operating specifications within a reasonable time is less than 10 watts. For example, the thermoelectric unit power requirements are 8.8 watts for 60 seconds. A thermoelectric module that fits this requirement is available with outside dimensions of 12.1×13.2×2.2 mm.

According to another aspect of the invention, the spinning disk(s) in the microdrive are used to assist in heat transfer.

According to an aspect of the invention, the temperature of the microdrive is monitored. If, for example, the microdrive is below −30 degrees C., the thermoelectric module is energized so that the surface closest to the cover of the microdrive, i.e. opposite to the fins, is heated. Heating proceeds with the spindle motor stopped until the drive temperature reaches at least −30 degrees C. At this time, the spindle motor starts while heating continues. After the drive reaches a temperature of 5 degrees C., i.e., the lower temperature specification of the microdrive, the heads can be loaded and the drive is ready for use. The spinning disks entrain air, especially between the inside of the top cover and the surface of the top disk. This provides faster and more even heating of the drive. Similarly, if a drive is too hot, the thermoelectric module is operated with the DC current flowing in the opposite direction, causing the drive cover to become cooler than ambient temperature. The spinning disks aid in the heat transfer process, increasing heat transfer by about ten times based on a rule of thumb for forced convection.

An advantage of this invention is that uses existing technology, i.e., thermoelectric modules, to solve a new problem, i.e., controlling the operating temperature of a microdrive, in a new way. The invention could be used by manufacturers of various small devices besides the small disk drive devices (microdrives) manufactured by IBM.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

FIGS. 1A, 1B, 1C and 1D illustrate different views of a microdrive using internal temperature control according to an exemplary embodiment of the invention.

Figure 1A:
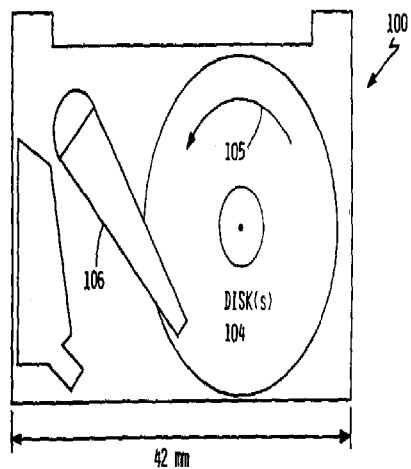
FIGS. 1A, 1B, 1C and 1D illustrate different views of a microdrive using internal temperature control according to an exemplary embodiment of the present invention.
Figure 1B:
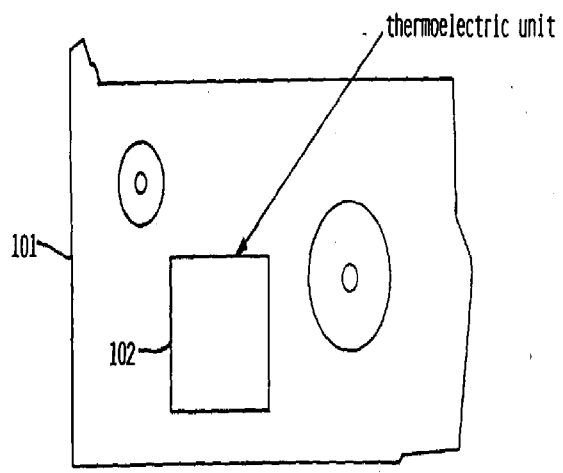

In particular, FIG. 1A shows a top view of a microdrive 100 with the cover 101, shown in FIG. 1B, removed and having a typical length of about 42 mm. With the cover 101 removed, one or more disks 104 which are driven by a motor (not shown) are visible. The disk(s) 104 rotate as represented by the arrow 105. A head-arm assembly 106 can also be seen with the cover 101 removed.

In operation, the disk(s) 104 rotate in the direction shown by arrow 105 and one end of the head-arm assembly 106 moves essentially radially with respect to the disk(s) 104 to position one or more read/write heads thereon in close proximity to selected locations on the surface(s) of the disk(s) 104 for reading and/or writing of data.

As mentioned earlier, the microdrive 100 has a range of temperatures outside of which such reading and writing operations cannot be performed without the risk of serious damage to the microdrive 100, data loss, or other consequences. Briefly, the disk(s) 104 rotate such that the disk surface(s) thereof move with respect to the read/write head (s) at relatively high speeds. The read/write heads 'fly' in close proximity to the rapidly moving disk surfaces. The height at which the read/write heads fly above the disk surface(s) may be affected by the internal temperature of the microdrive 100. Clearly, damage could be done to the disk surfaces and/or the heads should they come into contact while moving, which may result in data loss or worse. The elasticity of various components of the microdrive 100 is also affected by the internal temperature. Further, current flow and power dissipation of the electronic components (not shown) of the microdrive 100 are affected by the internal temperature. These and other temperature-related effects limit the temperatures at which the microdrive 100 can operate safely and effectively.

The embodiment of the invention illustrated uses a specially designed cover plate 101 for a microdrive 100 that incorporates a thermoelectric module 102. FIG. 1B shows a top view of the microdrive cover 101 having a thermoelectric unit 102 thereon. Such a thermoelectric unit 102 is preferably a Peltier thermoelectric module. Although shown disposed at the outside of the cover 101, the unit 102 could alternatively be disposed at the inside surface of the cover 101, or integrated with the cover 101 such that, when the cover 101 is placed on the microdrive 100, one side of the unit 102 is outside, and one side is inside the microdrive 100.

A Peltier module produces a temperature differential between two surfaces. The effect was discovered in 1834 by a person named Peltier. The principle is that when a current passes through the junction of two different conductors, a temperature change results. Typically, these modules use semiconductors, such as bismuth telluride. Devices that are commercially available are a sandwich structure as small as 2 millimeters (mm) square and 1 mm thick. Which of the plates is hot and which is cold depends ONLY on the direction of DC current flow.

Miniature thermoelectric modules with dimensions compatible with the size shown in the figures are easily capable of providing over 10 watts of heating power. The mass of a microdrive 100 is typically about 16 grams. A simple calculation shows that the required heating or cooling energy needed to bring the microdrive 100 to within correct operating specifications, within a reasonable time, is less than about 10 watts. For example, assuming a total mass of 28 grams, which includes the mass of the thermoelectric module, the specific heat for the mechanical parts within the microdrive 100 (largely composed of glass disks, aluminum and steel) will average about 0.1 cal/gram C. Assuming that the microdrive is at −40 degrees C. (a typical non-operating lower temperature specification) and needs to be heated to a temperature of 5 degrees C. (a typical operating lower temperature specification) within 10 seconds, the amount of heat energy required can be estimated by multiplying the specific heat times the mass times the time elapsed. For the above example, this calculation results in 126 calories of heat, which is the equivalent of only 527 watt-seconds. Therefore, the thermoelectric unit power requirements are 8.8 watts for 60 seconds. A thermoelectric module that fits this requirement is currently available from Melcor, Inc., in particular, model OT 2.0-65-F2A, having outside dimensions of 12.1 mm by 13.2 mm by 2.2 mm.

By integrating a Peltier thermoelectric device 102 into the cover 101 of a microdrive 100, the interior of the microdrive 100 can be easily heated or cooled. When cooling the interior, the outside of the microdrive 100 is more efficiently cooled by using a separate fan (not shown) combined with cooling fins on the microdrive 100 and/or module 102 (see FIG. 1D).

The spinning disk(s) 104 in the microdrive 100 are advantageously used to assist in heat transfer. Thus, the calculation results in the previous paragraph are an upper bound. In practice, based on laboratory testing, a microdrive motor can be started and spun without the heads loaded at a temperature as low as −30 C. The heat transfer either to or from the microdrive 100 can be aided by the rotating disk(s) 104 inside of the microdrive 100. By using the rotating disk(s) 104 as a means to circulate air, one potential limitation of solid state heating/cooling devices, e.g., Peltier thermoelectric modules, is overcome, since these devices generally require a fan or other air circulation means.

Air circulated by the disk(s) 104 inside the microdrive 100 casting increases the rate of heat transfer. However, if this would be insufficient for a particular installation, a further increase in the rate of heat transfer can be achieved by circulating the air outside the microdrive 100 casting by use of additional air circulating fans or the like (not shown).

Figure 1C:
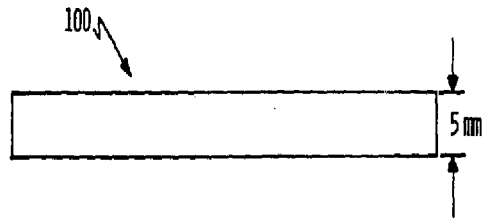

FIG. 1C shows a side view of the microdrive 100 with the cover 101 removed and having a typical thickness of about 5 mm.

Figure 1D:
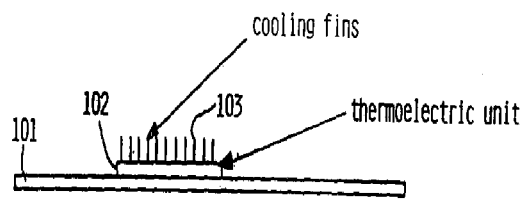
Figure 2:
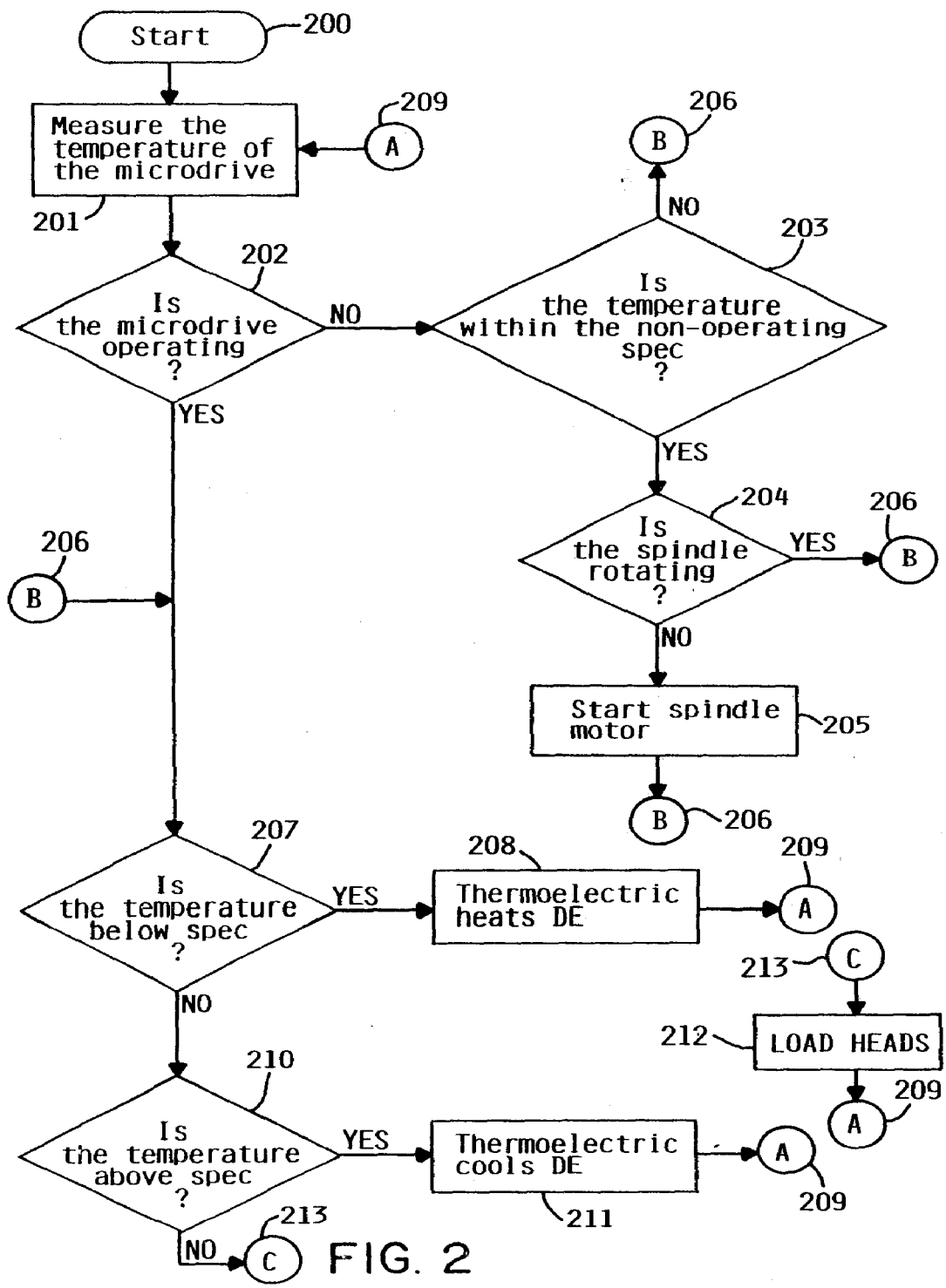

FIG. 1D is a side view of the microdrive cover 101 showing a thermoelectric unit 102 having cooling fins 103 thereon. It was already noted that the thermoelectric unit 102 can be placed either inside of the microdrive 100 or outside the microdrive 100. However, in a preferred embodiment, as shown in the figures, the device 102 is disposed outside of the microdrive 100 and attached to the top cover 101. The cooling fins 103 aid in expediting heat dissipation by presenting a greater surface area to circulating air than would otherwise be present.

By incorporating a thermoelectric unit 102 into the cover 101 of a microdrive 100, the present invention creates an environmental shell that operates in either a heating or cooling mode.

In an exemplary method of operation according to the invention, where the thermoelectric module 102 is mounted on the outside of a cover 101 of the microdrive 100, before starting the microdrive 100, the temperature of the microdrive 100 is measured using a temperature sensor. If the microdrive temperature is measured at below a spindle motor operating temperature of, for example, −30 degrees C., before starting the microdrive 100, the thermoelectric module 102 is energized so that the surface of the module 102 closest to the cover 101 of the drive 100, i.e. opposite to the fins 103, is heated. Heating proceeds with the spindle motor of the microdrive 100 off, i.e., stopped, until the microdrive temperature reaches at least −30 degrees C. At this time, the spindle motor of the microdrive 100 is started while heating continues. After the microdrive 100 reaches a temperature of 5 degrees C., the lower operating temperature specification, the heads can be loaded and the microdrive 100 is ready for use.

As noted above, the spinning disk(s) 104 entrain air, especially between the inside of the top cover 101 and the surface of the top disk 104. This provides faster and more even heating of the microdrive 100. Similarly, if a microdrive 100 is too hot, the thermoelectric module 102 is operated with the DC current in the opposite direction causing the microdrive cover 101 to become cooler than ambient temperature. For example, a microdrive 100 inside of an automobile might reach a high temperature of 75 degrees C., i.e., a non-operating temperature. Similar calculations to those already given above give a expected maximum power of only about 8 watts for 30 seconds (or 4 watts for 60 seconds). Again, however, the spinning disk(s) 104 greatly aid in the heat transfer process and based on a simple rule of thumb that forced convention increases heat transfer by about 10 times. Therefore, the power requirements for the thermoelectric module 102 are much less than the upper bounds previously calculated.

Figure 2:
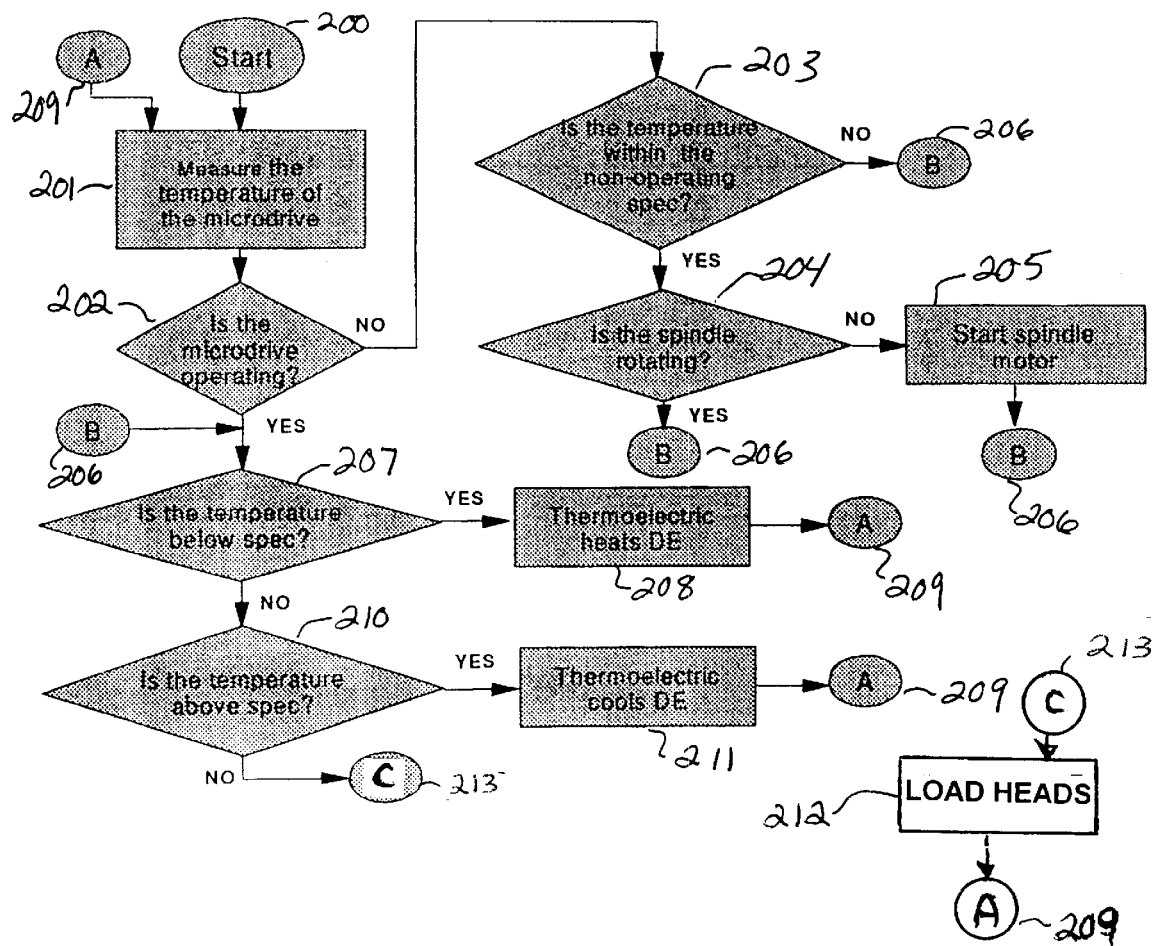
FIG. 2 is a flow chart illustrating a method of microdrive internal temperature control according to an exemplary embodiment of the invention.

A flow chart showing the operation of an exemplary embodiment of the present invention is shown in FIG. 2. The flow chart covers both heating and cooling of a microdrive 100 in order to keep its temperature within normal operating conditions when installed in a host system, such as a car radio (not shown), for example, that can provide electrical power to the microdrive 100. Note that the step of starting the spindle motor occurs when the temperature is within the "non-operating spec." Starting the spindle motor does not necessarily mean that the heads are then loaded onto the disks, which would occur only when the temperature is within the operating range "spec" for the drive. FIG. 2 is simply a flow chart illustrating the combined use of spindle motor and thermoelectric module to rapidly, and with maximum power efficiency, maintain the microdrive within a safe temperature range, according to an exemplary embodiment of the invention.

With reference to FIG. 2, the operation starts at 200 and proceeds to block 201 where the temperature of the microdrive is measured. At decision block 202, it is determined whether the microdrive is operating. If the determination is NO, then flow proceeds to decision block 203. At decision block 203, it is determined whether the temperature is within a 'non-operating spec' of the microdrive, that is, a temperature at which the spindle motor can be run, but at which the microdrive heads cannot necessarily be loaded, that is, the microdrive is not yet ready to be operated.

If the decision at block 203 is YES, then flow proceeds to decision block 204 where it is determined whether the spindle motor is rotating. If the decision in block 204 is NO, then flow proceeds to block 205 and the spindle motor is started. After the spindle motor is started, flow branches on branch B 206 to determine whether the temperature needs to be raised or lowered to reach an operating temperature range.

However, if in decision block 202, it is determined that the microdrive is operating, a YES decision, then flow proceeds to decision block 207 where it is determined whether the microdrive temperature is below "spec," i.e., a full operating temperature range lower limit. Branch B 206 from block 205, where the spindle motor was started, also enters decision block 207.

If the result of decision block 207 is YES, that is, that the microdrive temperature is below operating temperature "spec," then flow proceeds to block 208 where the thermoelectric module is activated to heat the microdrive. Flow then follows branch A 209 back to block 201, where the temperature of the microdrive is measured.

On the other hand, if in decision block 207, it is determined that the temperature of the microdrive is not below "spec" (NO), then flow proceeds to decision block 210, where it is determined if the temperature is above operating temperature "spec," i.e., a full operating temperature range upper limit.

If the result of decision block 210 is YES, that is, that the microdrive temperature is above operating temperature "spec," then flow proceeds to block 211 where the thermoelectric module is activated to cool the microdrive. Flow then follows branch A 209 back to block 201, where the temperature of the microdrive is measured.

On the other hand, if in decision block 210, it is determined that the temperature of the microdrive is not above "spec" (NO), and, necessarily not below 'spec' as determined in 207, then flow proceeds on branch C 213 to block 212 where the heads are loaded, i.e., the microdrive is prepared for operation. Then flow branches on branch A 209 back to block 201, where the temperature of the microdrive is measured. After some time delay between loading the heads at 212 and measuring the temperature at 201, the microdrive would proceed with normal reading and/or writing of data from/to the disk surfaces. At this point, the microdrive is operating normally, and the routine continues to measure the microdrive temperature at 201 for any change in temperature that would put the microdrive operation in jeopardy.

In other words, the microdrive operation is started if not already operating, or continued if already operating, after the heads are loaded in block 212, when the microdrive temperature is within the specification temperature range (NO's from decision block 207 and decision block 210) and the spindle motor is rotating (after 204 or 205 which branch to decision block 207).

The above-described flow chart is an example of how a method of controlling the temperature of a microdrive with a thermoelectric module could be implemented. Other methodology could be used and such would be considered to be within the spirit and scope of the invention. In the case of a device other than a microdrive, the methodology should be adapted to control the internal temperature of that particular device as needed, within the spirit and scope of the invention. For example, there may be a number of different operations a device performs, each having different specified temperature ranges, and the method would be adapted to control the temperature of the device accordingly. The thermoelectric unit described is well-suited to micro devices, however the invention is not limited thereto, and may be applicable to other-sized devices, e.g., mini-devices or nano-devices, the size of the thermoelectric unit being adjusted to suit the application.

At least portions of the invention may be embodied as a computer program product. A computer program product includes a recording medium, such as a floppy disk, a high-capacity read only memory in the form of an optically read compact disc or CD-ROM, a tape, a transmission type media, such as a digital or analog communications link, or a similar computer program product.

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

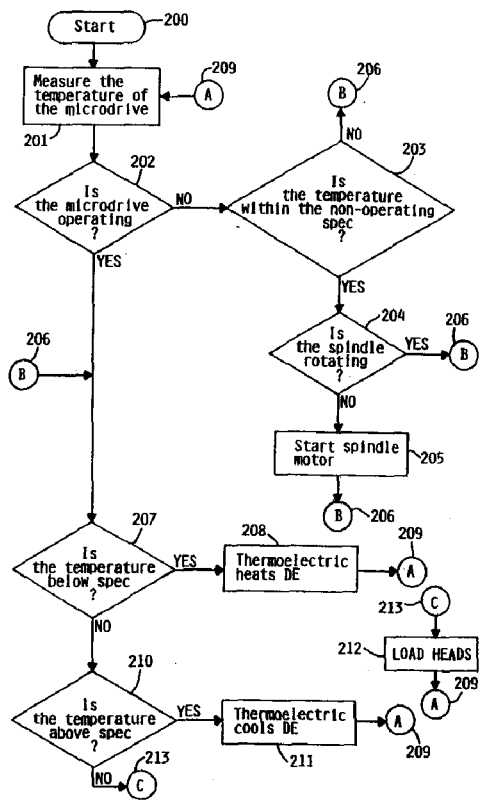

What is claimed is:

1. A temperature controlling arrangement for a temperature-sensitive disk drive device having a housing, comprising:
    a thermoelectric unit disposed at the housing of the temperature-sensitive disk drive device.

2. The temperature controlling arrangement according to claim 2, wherein the temperature-sensitive disk drive device comprises a microdrive.

3. The temperature controlling arrangement according to claim 2, wherein the thermoelectric unit comprises a device having two plates in contact with each other; and
    wherein when a direct current is caused to flow through one of the two plates to the other of the two plates, one of the two plates is heated and the other of the two plates is cooled by the direct current flow, which of the two plates is heated and which of the two plates is cooled is dependent on the direction of the direct current flow through the two plates.

4. The temperature controlling arrangement according to claim 3, wherein the two plates comprise metals.

5. The temperature controlling arrangement according to claim 3, wherein the two plates comprise semiconductors.

6. The temperature controlling arrangement according to claim 5, wherein at least one of the semiconductors comprises bismuth telluride.

7. The temperature controlling arrangement according to claim 1, further comprising cooling fins disposed on the thermoelectric unit.

8. The temperature controlling arrangement according to claim 1, wherein the thermoelectric unit is disposed on an outer surface of the housing.

9. The temperature controlling arrangement according to claim 1, wherein the thermoelectric unit is disposed on an inner surface of the housing.

10. The temperature controlling arrangement according to claim 1, wherein the thermoelectric unit is integral with a surface of the housing.

11. A method of temperature control, comprising utilizing the arrangement according to claim 1.

12. A method of temperature control for a temperature-sensitive disk drive device having a housing, comprising:

providing a thermoelectric unit at the housing of the temperature-sensitive disk drive device;

monitoring the temperature of the temperature-sensitive disk drive device; and when the monitoring of the temperature of the temperature-sensitive disk drive device indicates a temperature outside of an operating range, activating the thermoelectric unit to change the temperature of the temperature-sensitive disk drive device.

13. The method of temperature control according to claim 12; wherein activating the thermoelectric unit to change the temperature of the temperature-sensitive disk drive device comprises:

causing a direct current to flow through the thermoelectric device.

14. The method of temperature control according to claim 12, wherein the monitoring of the temperature of the temperature-sensitive disk drive device comprises:

determining if the temperature is above or below an operating temperature range;

when the determining indicates a temperature above the operating range, activating the thermoelectric unit to lower the temperature of the temperature-sensitive disk drive device; and when the determining indicates a temperature below the operating range, activating the thermoelectric unit to raise the temperature of the temperature-sensitive disk drive device.

15. A method of temperature control for a temperature-sensitive device having a housing, comprising:

measuring the temperature inside the housing;

detecting whether the device is operating;

if the device is not operating, then determining whether the temperature measured is within a first operating range;

if the temperature is within the first operating range, then determining if a first operation is being performed, and if the first operation is not being performed, perform the first operation;

if the device is operating or if the first operation is being performed, then determining whether the temperature is below a second operating temperature range;

if the temperature is below the second operating temperature range, then activating a thermoelectric unit to raise the temperature, and return to the measuring step;

if the temperature is not below the second operating temperature range, then determining whether the temperature is above the second operating temperature range;

if the temperature is above the second operating temperature range, then activating a thermoelectric unit to lower the temperature;

if the temperature is not above the second operating temperature range, then operating the device; and returning to the measuring step.

16. The temperature control method according to claim 15, wherein the temperature-sensitive device comprises a direct access storage device having a spindle, and wherein the first operation comprises rotating the spindle of the direct access storage device.

17. The temperature control method according to claim 16, wherein the direct access storage device has at least one head, and wherein the operating the device comprises loading the at least one head of the direct access storage device.

18. The temperature control method according to claim 17, wherein the first operating range has a lower limit of approximately −30 degrees C.

19. The temperature control method according to claim 18, wherein the second operating range has a lower limit of approximately 5 degrees C. and an upper limit of approximately 55 degrees C.

20. The temperature controlling arrangement according to claim 2, wherein the thermoelectric unit is activated to heat the temperature-sensitive disk drive device when the temperature-sensitive disk drive device is below a first temperature, and wherein the disk is rotated to cause air to circulate and thereby aid in heating the temperature-sensitive disk drive device only after the temperature-sensitive disk drive device reaches a second temperature that is higher than the first temperature.

21. The temperature controlling arrangement according to claim 2, wherein the thermoelectric unit is activated to cool the temperature-sensitive disk drive device when the temperature-sensitive disk drive device is above a first temperature, and wherein the disk is rotated to cause air to circulate and thereby aid in cooling the temperature-sensitive disk drive device only after the temperature-sensitive disk drive device reaches a second temperature that is lower than the first temperature.

* * * * *

UNITED STATES PATENT AND TRADEMARK OFFICE
CERTIFICATE OF CORRECTION

PATENT NO.      : 6,389,817 B1
DATED           : May 21, 2002
INVENTOR(S)     : Gordon James Smith It is certified that error appears in the above-identified patent and that said Letters Patent is hereby corrected as shown below:

Title page,
The Title page should be deleted and substitute therefore the attached Title page.

Drawings,
Replace the informal drawings "Figures 1A, 1B, 1C, 1D, and Figure 2" with the attached formal drawings –Figures 1A, 1B, 1C, 1D, and Figure 2 --

Column 8,
Line 39, after "device" add -- , and wherein the temperature-sensitive disk drive device comprises a rotating disk, and wherein the rotating disk causes air to circulate across at least one of: a surface of the thermoelectric unit; and/or a surface of the housing --.
Line 41, replace "2" with -- 1 --.
Line 44, replace "2" with -- 1 --.

Column 10,
Line 31, replace "2" with -- 1 --.
Line 40, replace "2" with -- 1 --.

Column 12,
Line 16, after "device" add -- , and wherein the temperature-sensitive disk drive device comprises a disk mounted for rotation, and wherein activating the thermoelectric unit to change the temperature of the temperature-sensitive disk drive device further comprises: only when the monitoring of the temperature of the temperature-sensitive disk drive device indicates a temperture within a second operating range, rotating the disk to cause air to circulate across at least one of a surface of the thermoelectric unit and a surface of the housing --.

Signed and Sealed this

Seventeenth Day of December, 2002

JAMES E. ROGAN
*Director of the United States Patent and Trademark Office*

United States Patent
Smith

(10) Patent No.: US 6,389,817 B1
(45) Date of Patent: May 21, 2002

(54) INTERNAL TEMPERATURE CONTROL FOR A MICRODRIVE

(75) Inventor: Gordon James Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/603,359

(22) Filed: Jun. 26, 2000

(51) Int. Cl.[7] .......................... F25B 21/02; F25D 23/12
(52) U.S. Cl. ...................... 62/3.2; 62/259.2; 62/3.3
(58) Field of Search .................... 62/3.2, 3.3, 3.7, 62/259.2

(56) References Cited

U.S. PATENT DOCUMENTS

| | | | |
|---|---|---|---|
| 5,093,832 A | * | 3/1992 | Bethune et al. .............. 372/21 |
| 5,483,799 A | * | 1/1996 | Dalto ............................ 62/3.7 |
| 5,603,220 A | * | 2/1997 | Seaman ........................ 62/3.7 |
| 5,689,654 A | * | 11/1997 | Kikinis et al. ............... 395/281 |
| 6,055,814 A | * | 5/2000 | Song ............................ 62/3.2 |
| 6,088,662 A | * | 7/2000 | Flinsbaugh et al. ......... 702/132 |
| 6,105,381 A | * | 8/2000 | Ghoshal ..................... 62/259.2 |
| 6,196,003 B1 | * | 3/2001 | Macias et al ................. 62/3.7 |

* cited by examiner

Primary Examiner—William C. Doerrler
(74) Attorney, Agent, or Firm—Christopher H. Lynt; Matthew J. Bussan

(57) ABSTRACT

The internal temperature of a small, temperature-sensitive device, such as a microdrive, can be controlled using a thermoelectric unit to permit the temperature-sensitive device to be used in a wider range of installations. In particular, a thermoelectric unit is provided at the housing of the temperature-sensitive device. A Peltier thermoelectric module is advantageously used to thereby provide an environmental shell that operates in either a heating or a cooling mode.

21 Claims, 2 Drawing Sheets